(12) United States Patent
Hull et al.

(10) Patent No.: US 6,172,378 B1
(45) Date of Patent: Jan. 9, 2001

(54) INTEGRATED CIRCUIT VARACTOR HAVING A WIDE CAPACITANCE RANGE

(75) Inventors: Christopher D. Hull, San Diego, CA (US); James Douglas Seefeldt, DeForest, WI (US); Kishore V. Seendripu, Laguna Niguel, CA (US)

(73) Assignee: Silicon Wave, Inc., San Diego, CA (US)

(*) Notice: Under 35 U.S.C. 154(b), the term of this patent shall be extended for 0 days.

(21) Appl. No.: 09/304,457

(22) Filed: May 3, 1999

(51) Int. Cl.[7] .............................. H01L 29/92; H01L 23/62

(52) U.S. Cl. ................................ 257/14; 257/13; 257/360

(58) Field of Search .................................. 257/360, 291, 257/14, 13

(56) References Cited

U.S. PATENT DOCUMENTS

| | | |
|---|---|---|
| 5,055,889 * | 10/1991 | Beall . |
| 5,430,317 | 7/1995 | Onai et al. ........................... 257/347 |
| 5,661,329 | 8/1997 | Hiramoto et al. .................... 257/510 |
| 5,744,840 * | 4/1998 | Ng . |
| 5,747,865 * | 5/1998 | Kim et al. . |
| 5,773,340 | 6/1998 | Kumauchi et al. ................... 438/234 |
| 5,861,645 * | 1/1999 | Kudo et al. . |
| 5,920,108 | 7/1999 | Hemmenway et al. .............. 257/508 |

FOREIGN PATENT DOCUMENTS

WO9626545  8/1996  (WO) .

OTHER PUBLICATIONS

Soorapanth et al., "Analysis and Optimization of Accumulation–Mode Varactor for RF ICs", *Symposium on VLSI Circuits Digeswt of Technical Papers*, pp. 32–33, Jun. 1998.

Castello et al., "A +/–30% Tuning Range Varactor Compatible with Future Scaled Technologies", Symposium on VLSI Circuits, New York, NY: IEEE, vol. Conf. 12, pp. 34–35 Jun. 11, 1998.

(List continued on next page.)

Primary Examiner—Stephen D. Meier
(74) Attorney, Agent, or Firm—Jaquez & Associates; Martin J. Jaquez, Esq.

(57) ABSTRACT

Integrated circuit varactor structures that include either an P-gate/N-well or N-gate/P-well layer configuration formed on an SOI substrate. The varactor structure is completely electrically isolated from the substrate of the IC by an oxide layer of the SOI substrate and by oxide-filled trenches formed on both sides of the varactor structures. The isolation trenches preferably extend to the oxide layer of the SOI substrate. The P-gate/N-well varactor structure includes $N^+$ implant regions formed in an N-well implant layer of the varactor. The $N^+$ implant regions comprise the source and the drain of a varactor. A LOCOS layer may be formed over the N-well layer where the P-gate is formed over the LOCOS layer. The P-gate may be formed of polysilicon. The N-gate/P-well varactor structure includes $P^+$ implant regions formed in a P-well implant layer of the varactor. The $P^+$ implant regions comprise the source and the drain of a varactor. A LOCOS layer may be formed over the P-well layer where the N-gate is formed over the LOCOS layer. The N-gate may be formed of polysilicon. The P-gate/N-well varactor is ideally suited for use as a binary or digitally-controlled varactor because it abruptly changes from a first lower capacitance of $C_1$ to a second higher capacitance of $C_2$ as the D.C. control voltage is varied from a first to a second threshold level. In contrast, the N-gate/P-well varactor finds utility as an analog timing varactor of a fully integrated VCO device, for example, because it slowly changes from a first lower capacitance of $C_1$ to a second higher capacitance of $C_2$ as the D.C. control voltage is varied from low to high threshold voltage levels.

27 Claims, 13 Drawing Sheets

OTHER PUBLICATIONS

Hui et al., "High–Q SOI Gated Varactor for Use in RF ICS", Annual IEEE International Silicon–on–Insulator Conference, New York, NY, Vo. Conf. 24, pp. 31–32, Oct. 5, 1998.

Mathi, Satwinder, "A SOI–CMOS Process for VLSI Technology", Navy Technical Disclosure Bulletin, Office of Naval Research, Arlington, VA, vol 10, No. 1, pp. 117–121, Sep. 1, 1984.

* cited by examiner

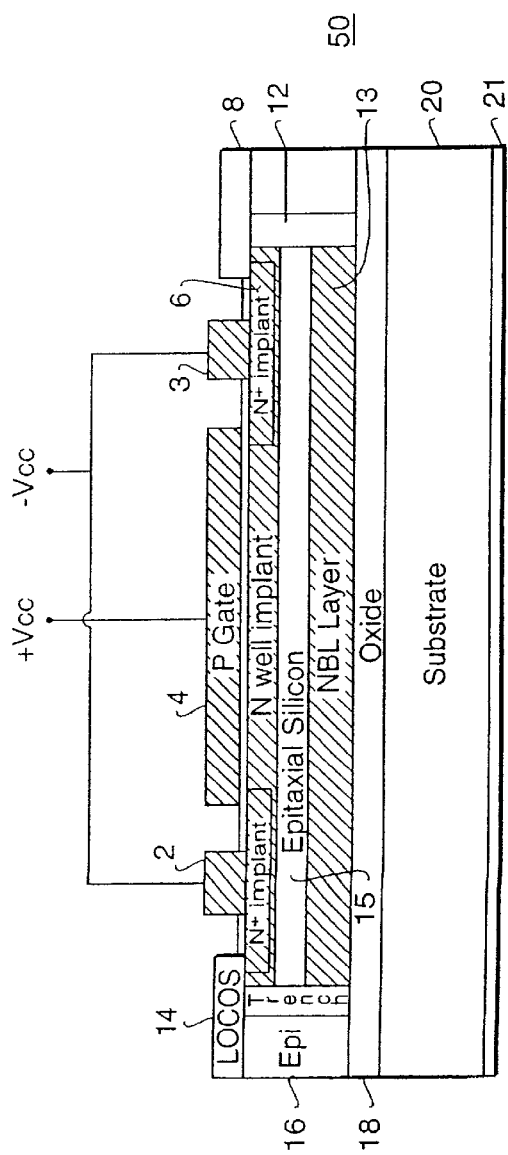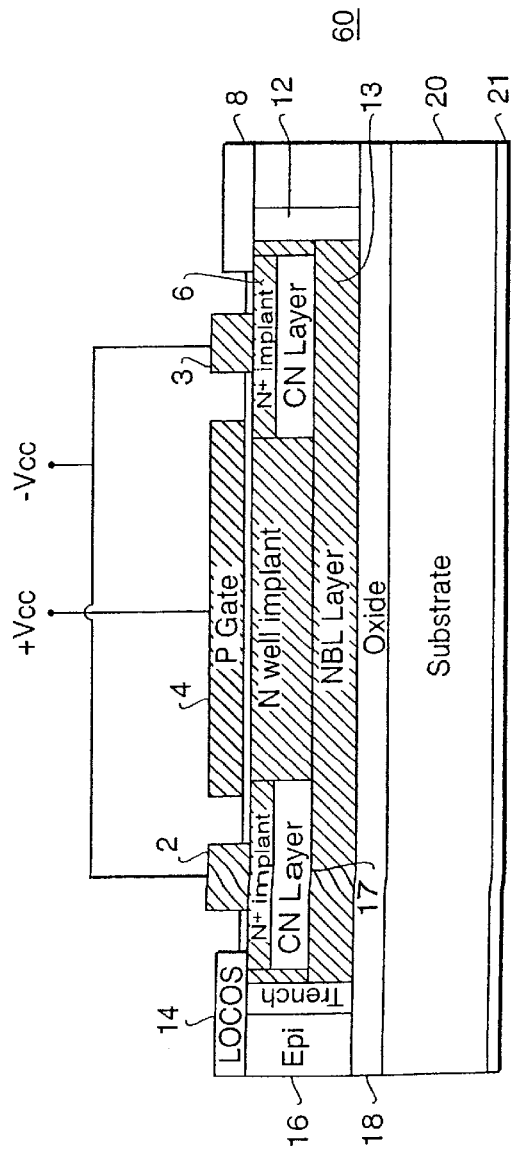

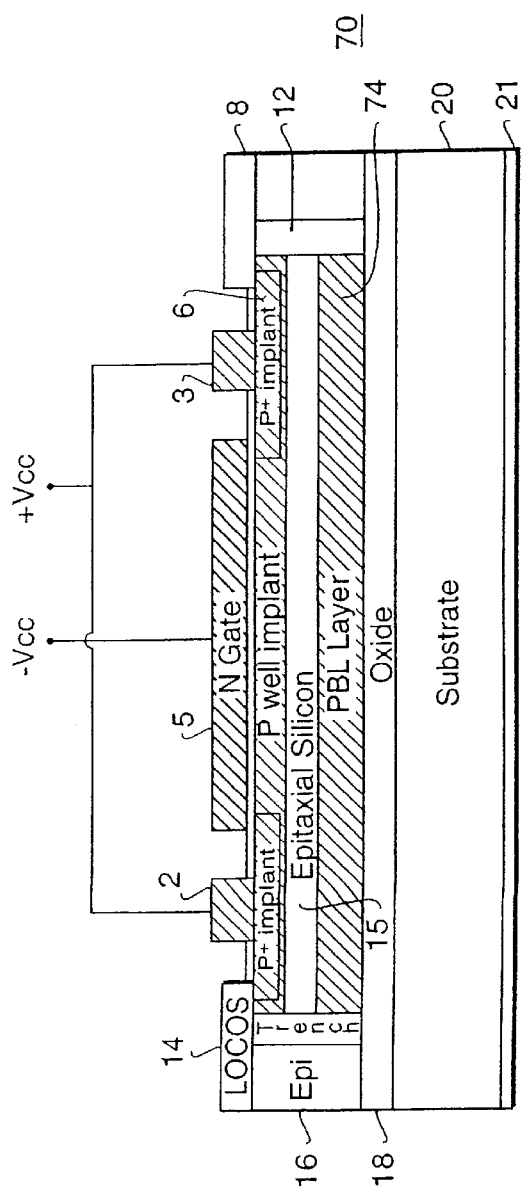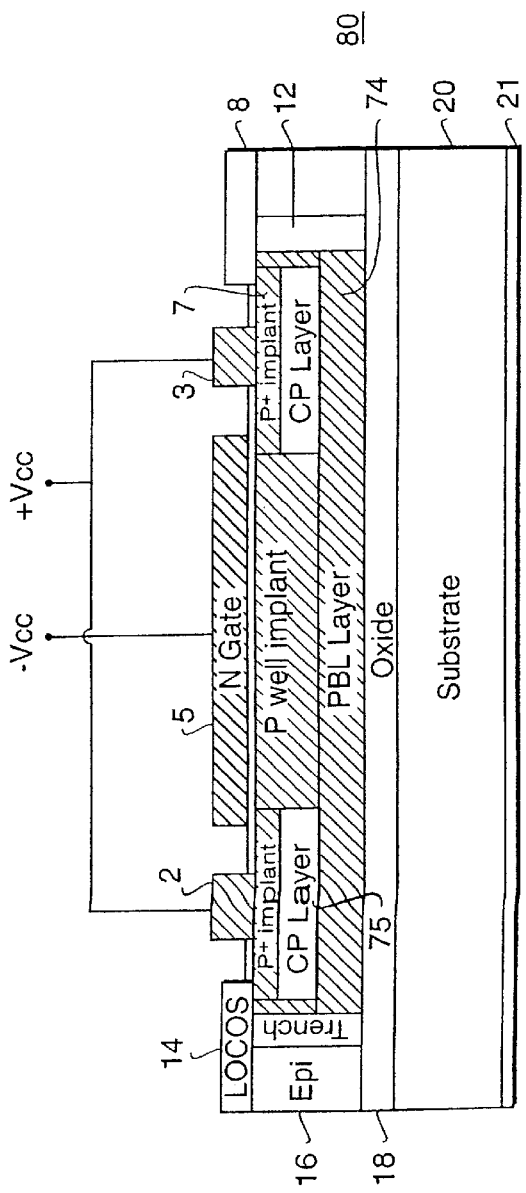

INTEGRATED CIRCUIT VARACTOR HAVING A WIDE CAPACITANCE RANGE

BACKGROUND OF THE INVENTION

1. Field of the Invention

This invention relates to integrated circuit varactors and more particularly to integrated circuit varactors having a wide capacitance range.

2. Description of Related Art

It is desirable to implement varactors on integrated circuits ("ICs") rather than implementing the varactors with discrete components in order to reduce the form factors and the cost of devices that require use of varactors. Disadvantageously, the IC varactors typically have unacceptably low capacitance ranges (on the order of an octave at most) and are susceptible to pickup from surrounding or neighboring IC components. This is particularly true for IC varactors that are used as part of a high frequency Voltage Controlled Oscillator ("VCO"). In a VCO, for example, it is desirable to have the ability to tune the oscillator over a wide range of frequencies. In practice the capacitance range of varactors incorporated in the VCO limits the tuning range of the VCO. Traditionally, IC varactors are formed from junction diodes. These IC varactors have upper and lower capacitance values that are separated by at most a factor of two, i.e., the ratio of the highest capacitance of the varactor to the lowest capacitance is equal to two. When these IC varactors are combined with traditional IC inductors, the tuning range of a VCO incorporating the varactor and the inductor is reduced to about 10% of a nominal frequency. In addition, disadvantageously, the capacitance of traditional IC varactors varies due to IC fabrication process variations. In particular, the capacitance of the IC varactors may vary by as much as 20% from part to part. These IC process variations are difficult if not impossible to control. Consequently, a VCO using such an IC varactor may be unable to tune to required frequencies thereby making the VCO unacceptable for use in many applications.

The prior art IC varactors are typically implemented in such a manner that an electrical junction is formed between the well and the substrate of the IC. This junction generates a non-linear capacitance. When the prior art IC varactors are employed in a VCO, the non-linear capacitance at the junction modulates the capacitance of the varactor. This, in turn, modulates the output frequency generated by the VCO. For example, if the VCO is generating a 2 GHz signal, the non-linear capacitance created at the junction between the well and substrate of the varactor may frequency modulate the signal by 100 KHz, for example. The VCO is therefore very sensitive to low frequency noise signals that often exist in radio frequency ("RF") systems. Consequently, a need exists for IC varactors that have reduced parasitic capacitance values or, at the least, linear capacitance values. The need also exists for IC varactors that have wide capacitance ranges, are easily and inexpensively manufactured, and that exhibit reproducible, reliable, and consistent capacitance properties independent of the specific manufacturing process used (i.e., independent of lot to lot variations). The present invention presents such an integrated circuit varactor and method of manufacturing the same.

SUMMARY OF THE INVENTION

The present invention is an integrated circuit varactor structure that includes either a P-gate/N-well or N-gate/P-well layer structure ideally formed on an SOI substrate. In the preferred embodiment, the varactor structure is completely isolated from the substrate of the integrated circuit by an oxide layer of the SOI substrate and by oxide-filled trenches formed on both sides of the varactor structure. The trenches preferably extend to the oxide layer of the SOI substrate.

The P-gate/N-well varactor structure preferably includes $N^+$ implant regions formed in the N-well implant layer of the varactor. The N-well implant layer of the varactor is preferably formed by lightly doping the N-well with appropriate n-type dopant materials. The $N^+$ implant regions preferably comprise highly doped $N^+$ regions diffused into the N-well implant layer. The $N^+$ implant regions preferably comprise the source and the drain of the varactor. A "Local Oxidation of Silicon", or "LOCOS" layer, may be formed over the N-well layer. The P-gate is preferably formed over the LOCOS layer. The P-gate is preferably formed of polysilicon material.

A variable capacitor or varactor is formed between the P-gate and the electrically coupled source and drain of the N-well varactor. The capacitance between the P-gate and the source/drain varies depending upon the D.C. bias voltage applied between the gate and source/drain terminals of the varactor. The varactor has an initial lower capacitance, $C_1$, at a first pre-determined voltage level. The capacitance of the N-well varactor then changes abruptly to a second, higher capacitance, $C_2$, when the applied voltage is changed to a second pre-determined voltage level. In one preferred embodiment of the N-well varactor, the voltage range between the first and second pre-determined voltage levels is approximately 750 mV. Advantageously, the N-well varactor may be used to implement an integrated "binary" capacitor wherein the capacitance of the varactor is controlled using a binary control voltage (i.e., a control voltage that has a "low" and a "high" state). The N-well is ideally suited for use in such an application because the capacitance of the varactor can be changed abruptly from a first, lower capacitance of $C_1$, to a second, higher capacitance of $C_2$.

In another embodiment of the present invention, an N-gate/P-well varactor structure includes $P^+$ implant regions formed in the P-well implant layer of the varactor. The P-well implant layer of the varactor is preferably formed by lightly doping the P-well with appropriate "P-type" dopant materials. The $P^+$ implant regions preferably comprise highly doped $P^+$ regions diffused into the P-well implant layer. The $P^+$ implant regions comprise the source and the drain of the varactor. A LOCOS layer may be formed over the P-well layer. The N-gate is preferably formed over the LOCOS layer. The N-gate is preferably formed of polysilicon material.

A variable capacitor or varactor is formed between the N-gate and the electrically coupled source and drain of the P-well varactor. The N-gate acts as one plate of the capacitor, while the source/drain act as the other gate. The effective distance between the plates is controlled by applying a D.C. voltage across the N-gate. At a first voltage level, the varactor has a first lower capacitance of $C_1$. The capacitance changes gradually from the first lower capacitance $C_1$ to a second, higher capacitance $C_2$ as the D.C. voltage is changed from a first to a second level. Because the capacitance of the P-well varactor changes gradually from $C_1$ to $C_2$, it finds utility in applications requiring linear, gradual capacitance modifications. One such application is use of the P-well varactor in a fully integrated Voltage Controlled Oscillator ("VCO"). The P-well varactor can be used to establish the oscillation frequency of the VCO. Because the inventive P-well varactor has low sensitivity for noise and interfering radio frequency ("RF") signals, it can advantageously be used in an integrated LC-resonator circuit to establish the oscillation frequency of the VCO.

BRIEF DESCRIPTION OF THE DRAWINGS

FIG. 5 is a cross-sectional view of an IC varactor structure made in accordance with the present invention where the structure has an N-well implant formed in an epitaxial silicon layer, an NBL layer formed below the epitaxial silicon layer, and a P-gate.

FIG. 6 is a cross-sectional view of an IC varactor structure made in accordance with the present invention where the structure has an N-well implant formed in a CN layer, an NBL layer formed below the CN layer, and a P-gate.

FIG. 8 is a cross-sectional view of an IC varactor structure made in accordance with the present invention where the structure has a P-well implant formed in an epitaxial silicon layer, a PBL layer formed below the epitaxial silicon, and an N-gate.

FIG. 9 is a cross-sectional view of an IC varactor structure made in accordance with the present invention where the structure has a P-well implant formed in a CP layer, a PBL layer formed below the CP layer, and an N-gate.

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Figure 1:
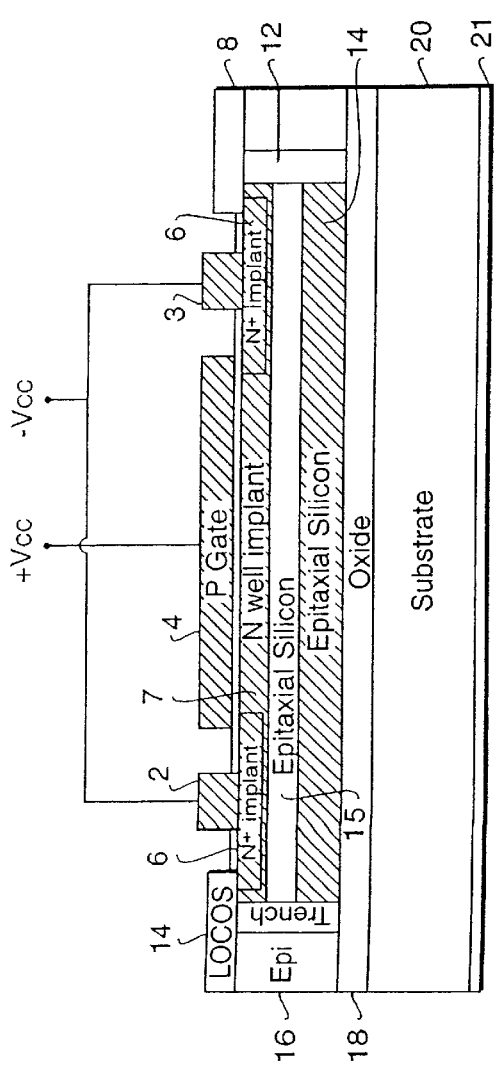
FIG. 1 is a simplified cross-sectional view of an IC varactor structure made in accordance with the present invention where the structure has an N-well implant formed in an epitaxial silicon layer.
Figure 2:
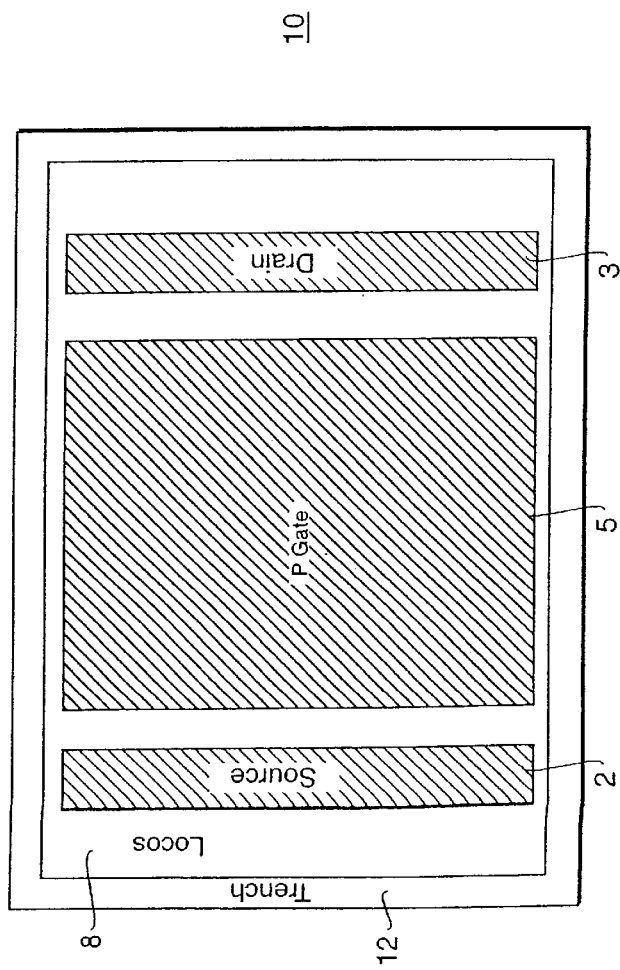
FIG. 2 is a top-level plan view of the IC varactor structure shown in FIG. 1.

Ideally, an integrated circuit ("IC") varactor has a wide capacitance range. Preferably, the ratio of the highest capacitance value to the lowest capacitance value is three or greater. One preferred embodiment of an N-well/P-gate IC varactor 10 is shown in FIGS. 1 and 2. FIG. 2 is a top-level plan view of the IC varactor 10 made in accordance with the present invention. The IC varactor 10 comprises a P-gate/ N-well varactor preferably formed on a Silicon On Insulator ("SOI") substrate. FIG. 1 is a cross-sectional view of the IC varactor 10 shown in FIG. 2.

As shown in FIG. 1, the preferred P-gate/N-well IC varactor 10 includes an N-well implant layer 7 formed in an epitaxial silicon layer 15, an undoped epitaxial silicon layer 14, two Ac implant regions 6 formed in the N-well implant layer 7, oxide filled trenches 12 formed on both side of the implant layer 7, Local Oxidation of Silicon ("LOCOS") layers 14 and 8, and side epitaxial silicon layers 16. The N-well varactor structure also preferably includes a metal source 2, a metal drain 3, a polysilicon P-gate 4, a substrate 20, a silicon-oxide layer 18, and a Printed Circuit Board ("PCB") 21. As shown in FIG. 1, the varactor 10 is preferably formed on a Silicon On Isolator ("SOI") substrate. The SOI substrate in this structure 10 includes the substrate 20, the silicon oxide 18, and the epitaxial silicon layer 14. In a preferred embodiment, the substrate 20 comprises a high resistivity substrate. In particular, in the preferred embodiment, the substrate 20 has a resistivity of about 1 kohm-cm. The source 2 and drain 3 are electrically coupled to the $N^+$ implant regions 6.

Figure 10:
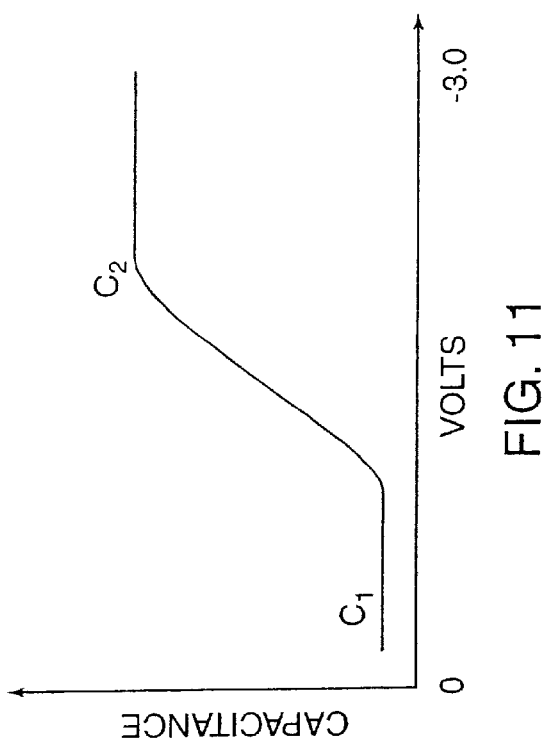
FIG. 10 is a graph detailing the approximate ratio of capacitance versus voltage for the N-well IC varactors shown in FIGS. 1, 5, 6, and 7.

A variable capacitor or varactor is formed between the P-gate 4 (acting as one plate of the capacitor) and the source 2/drain 3. As shown in FIG. 1, a positive voltage, +Vcc is applied to the P-gate 4 of the varactor 10. A negative voltage, −Vcc is placed across the electrically coupled source 2 and drain 3. The P-gate 4 acts as one plate of the varactor 10. Together, the electrically coupled source 2 and drain 3 act as the other plate of the varactor 10. The effective distance between the capacitor plates is regulated by the direct current ("D.C.") voltage applied to the P-gate. As shown in the capacitance versus voltage plat of FIG. 10, the varactor has an initial capacitance, $C_1$, when the D.C. voltage applied to the P-gate 4 is equal to or less than a first predetermined voltage level (i.e., from 0 to the first threshold). The capacitance of the varactor 10 abruptly changes to a second, higher capacitance, $C_2$, when the voltage applied to the P-gate 4 reaches a second determined level. The capacitance of the varactor 10 remains approximately constant up to an applied D.C. voltage level of 3 volts. It is noted that $C_2$ is nominally equal to $(\epsilon_0 \epsilon_{ox}/A_{ox}) \times A$ where A varies as a function of the design, $\epsilon_0 = 8.85 \times 10^{-14}$ farads/cm, $\epsilon_{ox} \approx 3.75$, and $A_{ox} = 90$ angstroms. It is also noted that $C_2$ is approximately equal to $3 \times C_1$ in the exemplary embodiment.

In one preferred embodiment of the varactor 10, $C_2$ is approximately 2 to 3 times greater than the first capacitance $C_1$. That is, the ratio of the capacitance $C_2/C_1$ is equal to approximately 2 or 3 for this varactor structure 10. In one preferred embodiment of the present invention, the voltage range between the first capacitance $C_1$ and the higher, second capacitance of $C_2$ is approximately 750 mV.

The capacitance between the P-gate 4 and the well implant 7 (the "gate-to-bulk" capacitance $C_{gate-bulk}$), that is, the capacitance between the P-gate 4 and the electrically-coupled source 2 and drain 3 of the P-gate/N-well varactor 10, varies depending upon the D.C. bias voltage applied between the terminals of the P-gate and the source/drain. By varying the D.C. bias voltage applied to the P-gate 4 of the N-well varactor 10 of FIG. 1, the capacitance value is varied between $C_1$ and $C_2$. If the first voltage threshold represents a Boolean logic value of "zero", and the second voltage threshold represents a logical "one", then the capacitance $C_{gate-bulk}$ (V) can be digitally controlled using one control bit to be equal to either $C_1$ (when a logical zero is applied) or $C_2$ (when a logical one is applied). Thus, the varactor 10 shown in FIG. 1 can be used as a "binary" capacitor because the capacitance of the device can be digitally controlled to assume one of two possible values.

Advantageously, the present P-gate/N-well varactor 10 of FIG. 1 can be used as an integral building block in any integrated circuit that requires the use of passive components having improved tolerances. For example, the P-gate/N-well varactor 10 can be used to improve the performance of integrated circuit implementations of tuned capacitor networks such as voltage-controlled oscillators (VCO). Further, the present P-gate/N-well varactor 10 can be used to implement a means of calibrating (both manually and automatically) a tuned capacitor network such as a VCO. Those skilled in the integrated circuit design and fabrication art will recognize that the present P-gate/N-well varactor 10 of FIGS. 1 and 2 can be used to improve the performance of any integrated circuit requiring the use of passive electrical components.

Figure 3:
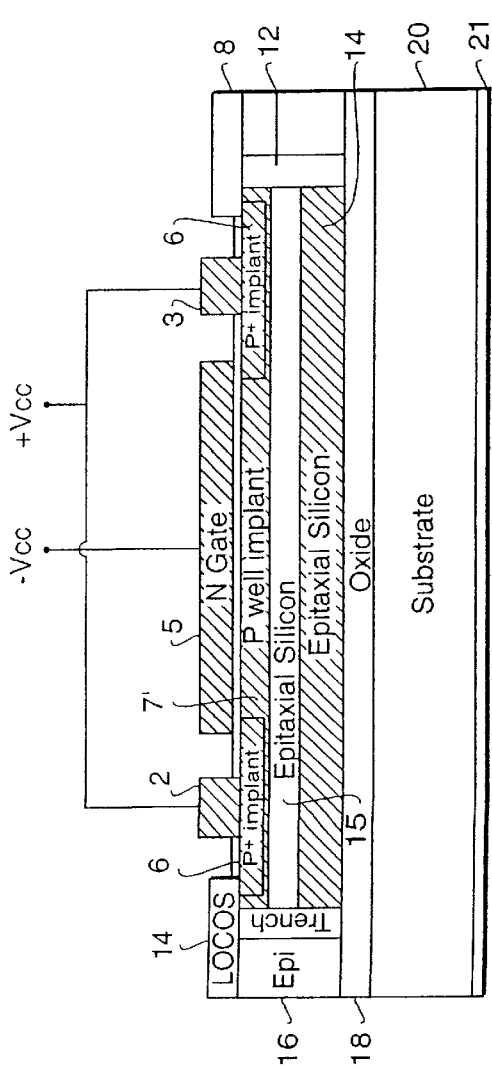
FIG. 3 is a cross-sectional view of an IC varactor structure made in accordance with the present invention where the structure has a P-well implant formed in an epitaxial silicon layer.
Figure 4:
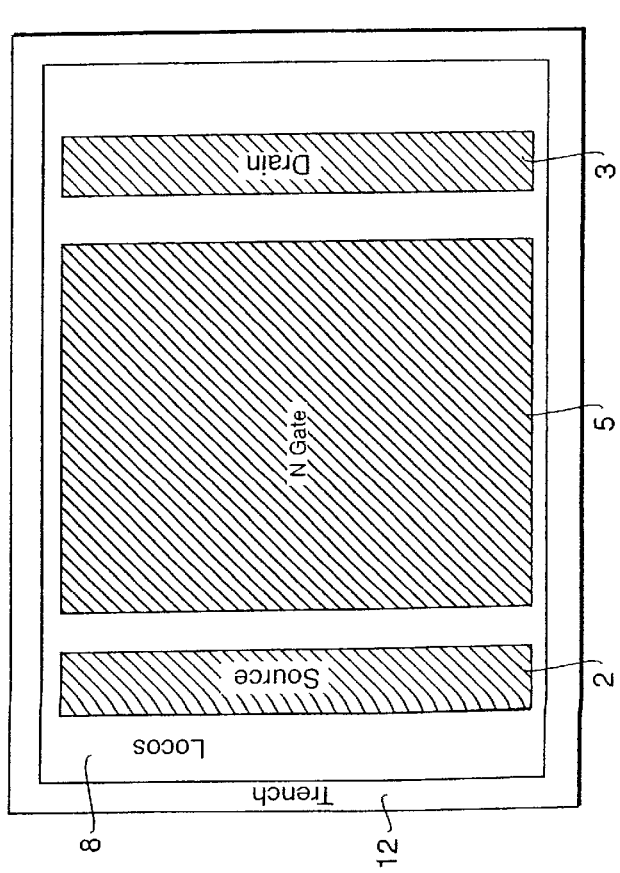
FIG. 4 is a top-level plan view of the IC varactor structure shown in FIG. 3.

Another embodiment of the inventive varactor 30 made in accordance with the present invention is presented with reference to FIGS. 3 and 4. FIG. 4 is a top-level plan view of an exemplary N-gate/P-well IC varactor 30. The N-gate/P-well varactor 30 preferably is fabricated on a Silicon On Insulator ("SOI") substrate. FIG. 3 is a cross-sectional view of the N-gate/P-well IC varactor 30 shown in FIG. 4. As shown in FIG. 3, the N-gate/P-well varactor structure 30 preferably includes a P-well implant layer 7 formed in an epitaxial silicon layer 15, an undoped epitaxial silicon layer 14, two P+ implant regions 6 formed in the P-well implant layer 7', oxide filled trenches 12, Local Oxidation of Silicon ("LOCOS") layers 14 and 8, and side epitaxial silicon layers 16.

The structure also includes a metal source 2, a metal drain 3, a poly-silicon N-gate 5, a substrate 20, a silicon oxide layer 18, and a Printed Circuit Board ("PCB") 21. As shown in FIG. 3, the varactor 30 is preferably formed on a Silicon-On-Isolator ("SOI") substrate. The SOI substrate in the structure 30 of FIG. 3 preferably comprises the substrate 20, the silicon oxide 18, and the epitaxial silicon layer 14. In a preferred embodiment, the substrate 20 is a high resistivity substrate. In particular, the substrate 20 preferably has a resistivity of approximately 1 kohm-cm. The source 2 and drain 3 are electrically coupled to the P+implant regions 6'.

Figure 11:
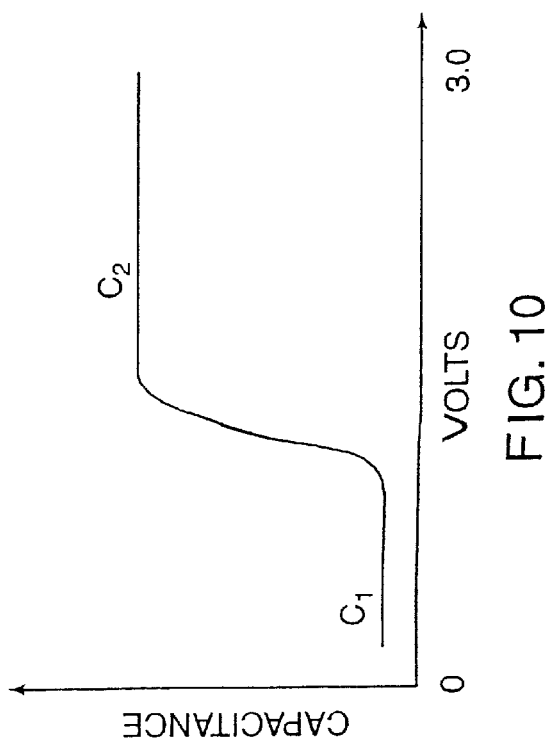
FIG. 11 is a graph detailing the approximate ratio of capacitance versus voltage for the P-well IC varactors shown in FIGS. 2, 8, and 9.

A variable capacitor or varactor is formed between the N-gate 5 and the source 2 and drain 3. As shown in FIG. 3, a negative voltage, −Vcc is preferably applied to the N-gate of the varactor 30. A positive voltage, +Vcc is preferably applied to the source 2 and drain 3. The N-gate acts as one plate of the varactor. The electrically coupled source 2 and drain 3 act as the other plate of the varactor 30. As shown in the capacitance versus voltage plot of FIG. 11, the effective distance between the plates, and thereby the capacitance, amount of D.C. is regulated by the voltage applied to the N-gate 5. As shown in FIG. 11, the varactor 30 has an initial capacitance, $C_1$ as the D.C. voltage applied to the N-gate 5 varies from 0 volts to a third predetermined level. The capacitance of the varactor 30 then changes gradually from the first capacitance, $C_1$ to a second, higher capacitance, $C_2$, until the applied voltage reaches a fourth determined level. The capacitance of the varactor 30 then remains approximately constant (equal to $C_2$) up to a DC voltage level of approximately −3 volts. In a preferred embodiment the third predetermined voltage has a value of about 1.2 volts and the fourth predetermined voltage has a value of about 1.8 volts.

FIG. 5 is a cross-sectional diagram of another preferred IC P-gate/N-well varactor structure 50 made in accordance with the present invention. In this preferred embodiment, the second epitaxial silicon layer 14 (shown in FIG. 1) is replaced with an N-type buried layer 13 ("NBL"). Consequently, the IC varactor structure 50 of FIG. 5 has lower resistivity between the capacitor plates (i.e., between the P-gate 4 and the source/drain 2/6), which may increase the performance of the varactor 50. FIG. 6 is a cross-sectional diagram of yet another preferred IC P-gate/N-well varactor structure 60 made in accordance with the present invention. In this preferred embodiment, the first epitaxial silicon layer 15 (of FIGS. 1 and 5) is replaced with an N-type collector ("CN") 17 and the second epitaxial silicon layer 14 (of FIG. 1) is replaced with an N-type buried layer 13 ("NBL"). The IC varactor structure 60 has an even lower resistivity between the capacitor plates than the IC varactor structure 50 of FIG. 5, which may further improve the performance of the varactor structure of the present invention.

FIG. 8 is a simplified cross-sectional diagram of another preferred IC N-gate/P-well varactor structure 70 made in accordance with the present invention. In this embodiment, the second epitaxial silicon layer 14 (of FIG. 3) is replaced with an P-type buried layer 74 ("PBL"). Consequently, the P-well IC varactor structure 70 has lower resistivity between the capacitor plates (ie., between the N-gate and the source/drain), which improves the performance of the varactor 70. FIG. 9 is a cross-sectional diagram of yet another preferred IC N-gate/P-well varactor structure 80 made in accordance with the present invention. In this preferred embodiment, the first epitaxial silicon layer 15 (of FIGS. 3 and 8) is preferably replaced with a P-type collector ("CP") 75. The second epitaxial silicon layer 14 (FIG. 3) is replaced with an P-type buried layer 74 ("PBL"). The IC varactor structure 80 may have even lower resistivity between the capacitor plates than the IC varactor structure 70, which may further improve the performance characteristics of the varactor 80.

Figure 7:
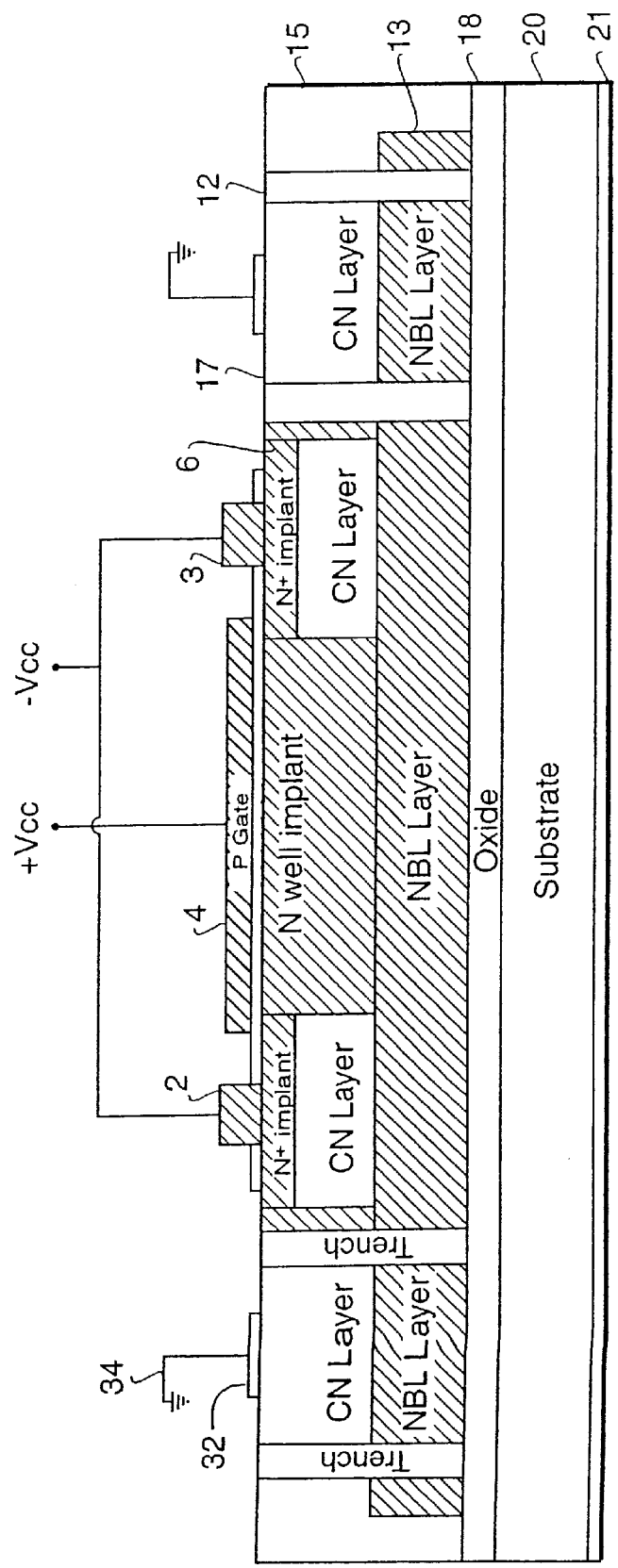
FIG. 7 is a cross-sectional view of the IC varactor shown in FIG. 6, wherein the varactor is modified to include a guard ring which first electrically isolates the IC varactor from neighboring IC components.

In all of the embodiments described above, the P-gate/N-well structures and the N-gate/P-well structures are preferably completely isolated from the substrate 20 by the silicon oxide layer 18 and the oxide filled trenches 12. This electrical isolation technique helps to electrically isolate and de-couple the IC varactors from neighboring IC components. In high frequency applications such as applications involving radio frequency ("RF") components, further isolation techniques may be required. FIG. 7 is a cross sectional diagram of an exemplary structure that further isolates the IC varactor structure 60 shown in FIG. 6 from neighboring IC components. As shown in FIG. 7, the IC varactor structure 60 is isolated by an isolating guard ring configuration. The guard ring isolation technique is described in detail in the copending and commonly-assigned application entitled, "Trench Isolated Guard Ring Region for Providing RF Isolation," filed Feb. 23, 1999 and assigned application number 09/255,747. This potent application is hereby incorporated by reference for its teachings on guard ring region isolation techniques.

As shown in FIG. 7, the IC varactor structure 60 of FIG. 6 is preferably inserted in a mesa formed by a guard ring comprising oxide-filled U-trenches 12 immediately adjacent to and surrounding the varactor structure 60. Each U-trench has adjacent CN and NBL conductive regions coupled to a ground 34 via a metal contact 32. The conductive regions are also surrounded and thereby isolated by U-trenches. As described in the co-pending and incorporated patent application, the guard ring isolation configuration further isolates the IC varactor structure 60 from neighboring IC components. This isolation improves the performance of the varactor, greatly reduces sensitivity to noise and interfering signals, and enhances its utility when used in RF applications.

The IC varactors described above with reference to FIGS. 1–11 preferably are implemented and fabricated using a Silicon-On-Insulator (SOI) technology. As shown in FIGS. 1 to 9, an insulating oxide layer 18 separates the N (or P) well implant layers 7 from the solid silicon substrate 20. The advantages of SOI BiCMOS process technology include greater signal isolation, higher speed devices with lower power consumption, and dense digital CMOS logic. The circuitry of the present invention is preferably implemented in an SOI BiCMOS process technology that uses bonded wafers ("bonded SOI"). Bonded SOI processes are well-known to those of ordinary skill in the art and are believed to be currently available. Examplary SOI BiCMOS process technologies that may be used to implement the inventive varactor structure are described in U.S. Pat. No. 5,661,329 entitled "Semiconductor Integrated Circuit Device Including An Improved Separating Groove Arrangement", U.S. Pat. No. 5,773,340 entitled "Method of Manufacturing a BIMIS", and U.S. Pat. No. 5,430,317 entitled "Semiconductor Device", the complete disclosures of which are all hereby fully incorporated into the present application by reference.

Figure 12:
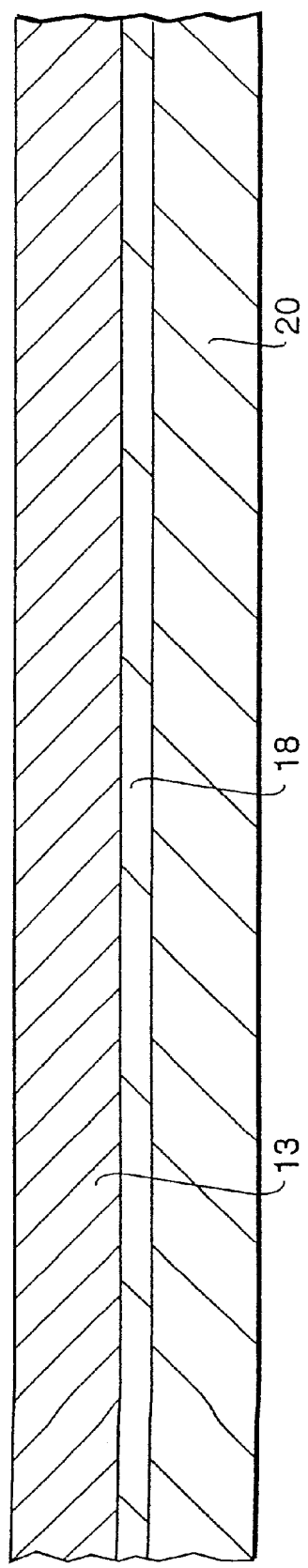
FIGS. 12 to 18 are sectional views of an exemplary method of fabricating the inventive IC varactor structure.

A process for producing or manufacturing the IC varactor 60 having an isolation guard ring as shown in FIG. 7 is now described with reference to FIGS. 12 to 18. Although the process of fabricating the varactor 60 of FIG. 7 is described in detail below, those skilled in the art of IC manufacturing processes will appreciate that, with slight modification, similar techniques may be used to fabricate any of the varactor structures described above. As shown in FIG. 12, the support substrate 20 is prepared and formed with the oxide-filled insulating layer 18 covering its main surface. As noted above, the substrate 20 is preferably a high resistivity substrate. The insulating layer 18 is preferably formed of a silicon-oxide film, such as $SiO_2$. Optimally, the silicon-oxide film comprising the insulating layer 18 is formed by thermally oxidizing the substrate 20.

Next, the NBL, N-type buried layer 13 is formed over the insulating layer 18. In order to form the NBL 13 a semiconductor substrate (not shown) is first laid over the top surface of the insulating layer 18. Optimally, the semiconductor substrate is adhered to the insulating layer 18 using a heat treatment. The thickness of the upper surface of the semiconductor substrate is then reduced using a polishing treatment. The thinned semiconductor substrate is then doped with an N-type using, for example, an ion implantation method. The semiconductor substrate is then preferably thermally diffused to form the $N^+$-type buried layer 13.

Figure 13:
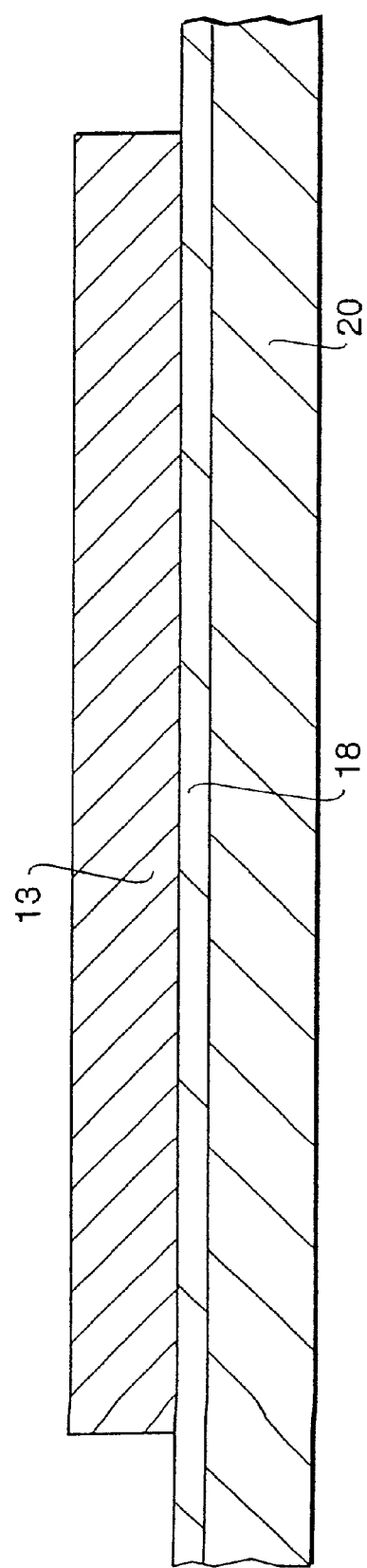
Figure 14:
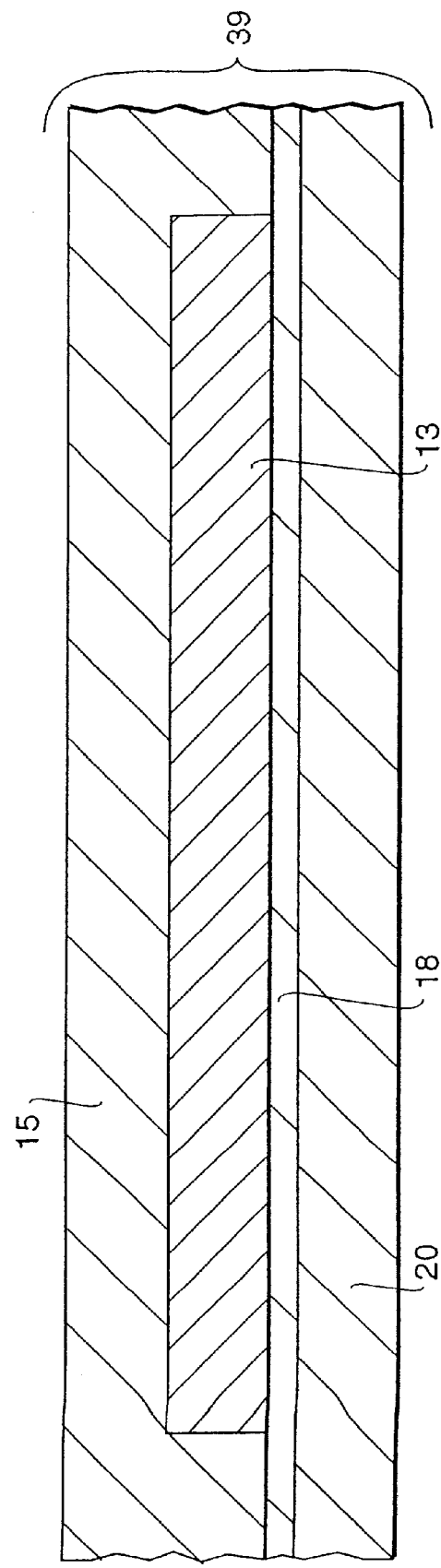

A first anisotropic etching, such as a Reactive Ion Etching (RIE), may be used to etch the NBL 13 to form the structure shown in FIG. 13. Then, as shown in FIG. 14, an $n^-$-type epitaxial layer 15 is grown over the surface of the NBL 13 using an epitaxial growth process. N-type impurity of the NBL layer 13 diffuses slightly into the $N^-$-type epitaxial layer 15. The result is a SOI substrate 39 having a multi-layered structure that includes the NBL 13 and the $N^-$-type epitaxial layer 15 laid over the surface of the insulating layer 18 and the NBL 13. The epitaxial layer 15 and the NBL (buried layer) 13 are exemplary semiconductor layers that may be formed on the insulating layer 18.

Figure 15:
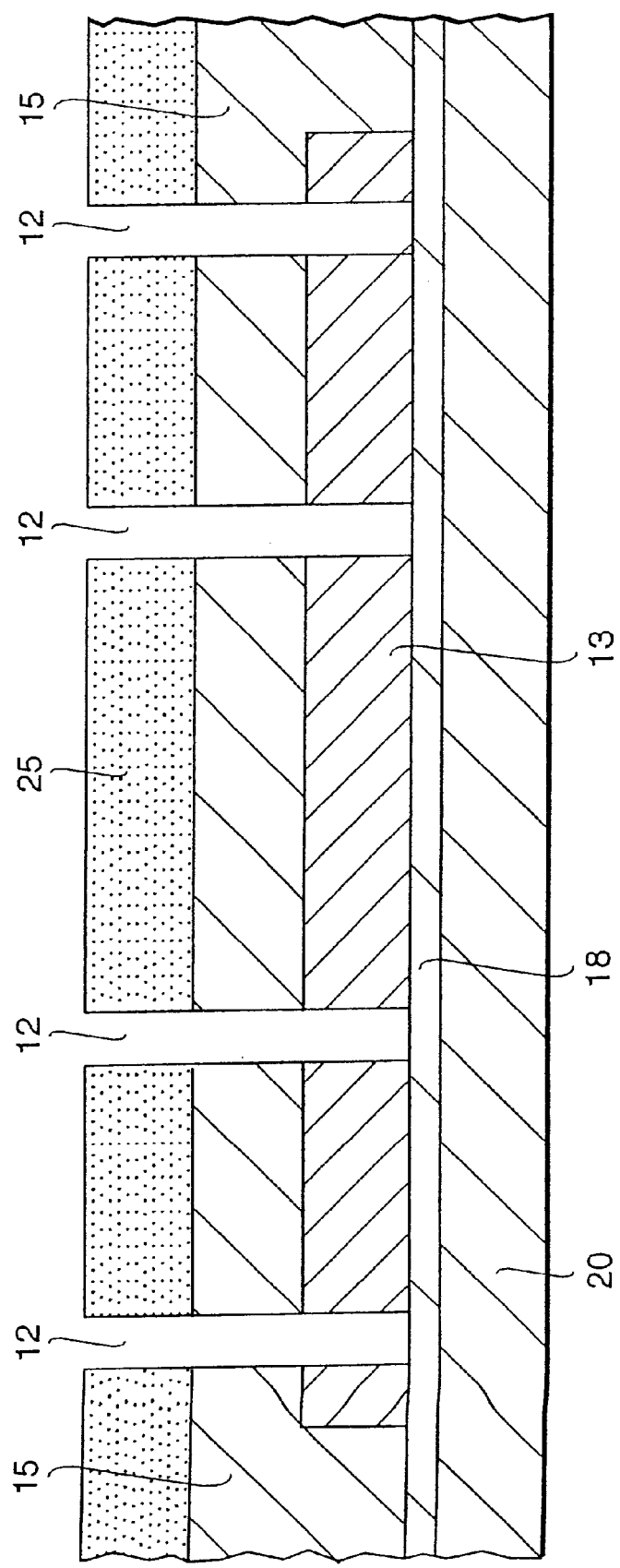

In the next step, the trenches 12 of the guard ring are formed as shown in FIG. 15. Anisotropic etching such as RIE can be used to form the trenches 12. As shown in FIG. 15, the trenches 12 preferably extend from the main surface of the epitaxial layer 15 to the insulating layer 18. A photoresist 25 as shown in FIG. 15 may be used as a mask for the etching. Alternatively, a hard mask may be used to etch the trenches 12 versus the photoresist 25. Then the photoresist 25 is removed and an insulator is preferably buried in the trenches 12. Depositing a silicon-oxide film over the main surface of the epitaxial layer 15 may form the insulator using the well-known CVD method. Then the silicon-oxide film is etched off the epitaxial layer 15. The thickness of the etch-back performed is the same as the thickness of the silicon-oxide film needed to fill the trenches 12 with silicon-oxide. The silicon oxide film is preferably over-etched on the surface of the IC 60 everywhere except on the inside of the trenches 12. In another embodiment, the trenches 12 may be filled with other materials, such as for example, oxide/polysilicon.

Figure 16:
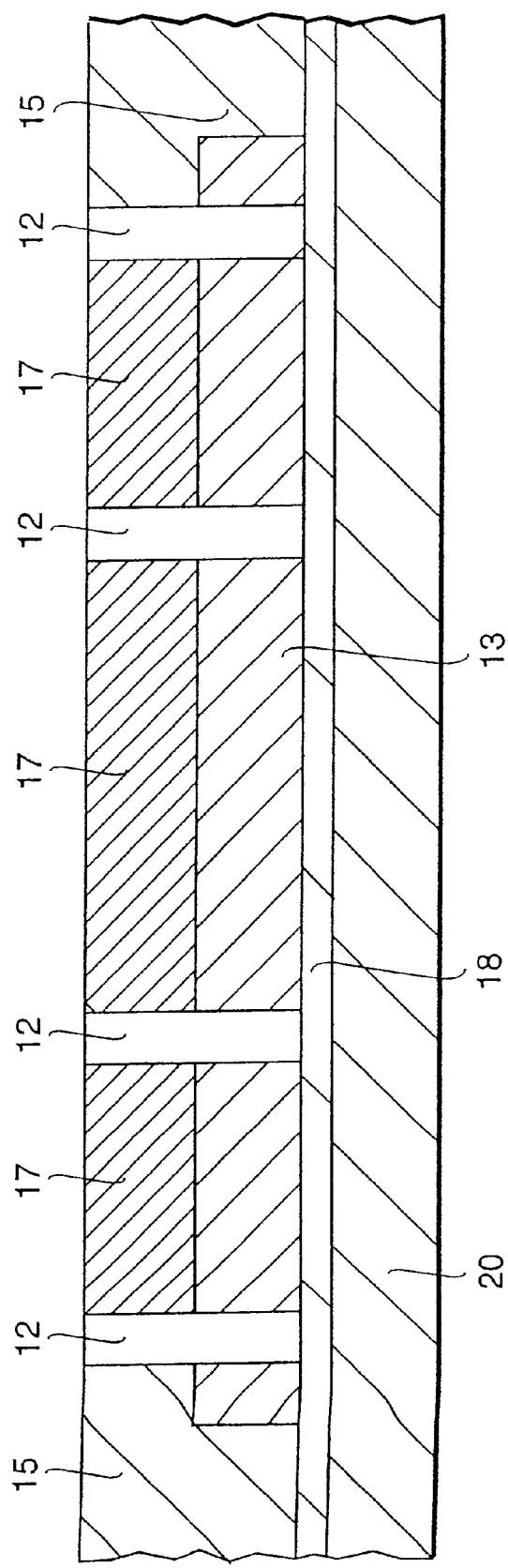

Subsequently, as shown in FIG. 16, the N-type collector (CN) 17 is implanted into the guard ring regions and the NBL layer 13 of the varactor 60. Specifically, the surface of the regions may be selectively doped with an N-type impurity (using, e.g., a phosphorous material) via ion implantation. Thermal diffusion is then performed to generate the CN layer 17 in the epitaxial layer 15. The CN layer 17 is preferably heavily doped. In other embodiments as described above, the collector layer 17 may be formed from P-type material.

Figure 17:
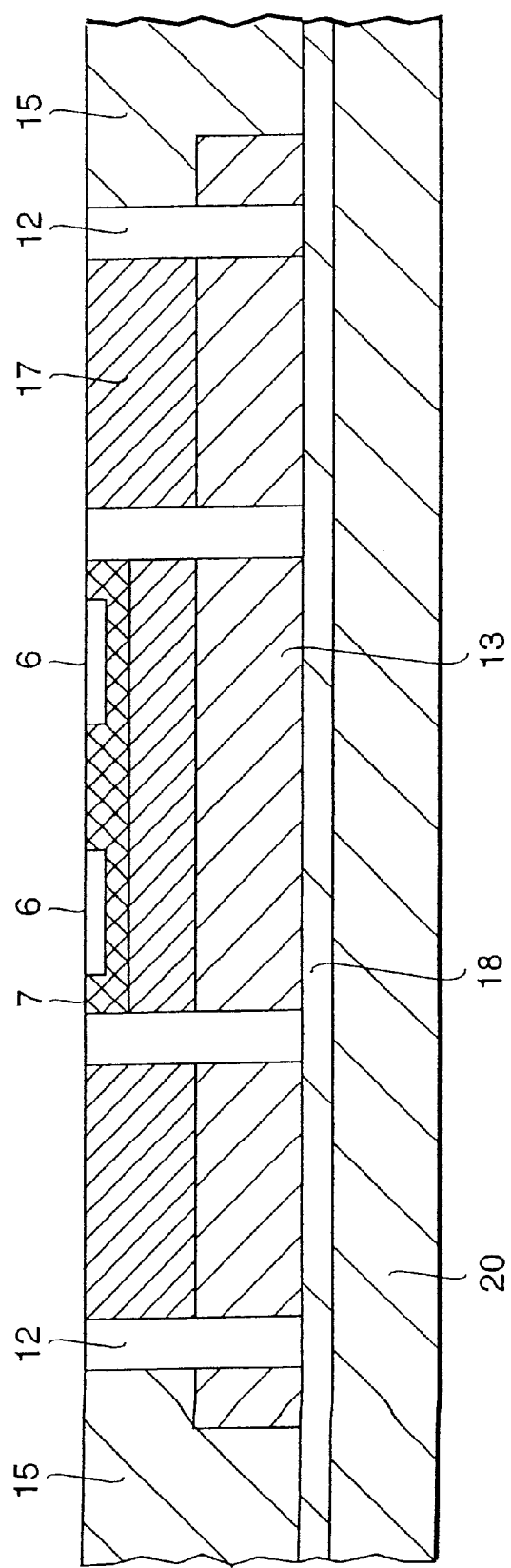

As shown in FIG. 17, the N-well implant layer 7 is then formed in the CN layer 17 of the varactor 60 and the $N^+$ implant regions 6 are preferably formed in the N-well implant layer 7. Specifically, the surface of the CN layer 17 may be further doped with an N-type impurity (such as a phosphorous material) via ion implantation. Thermal diffusion may then be performed to generate the N-well implant layer 7 in the CN layer 17 of the varactor 60. Selected regions of the N-well implant layer 7 then may be doped with $N^+$-type impurities to form the $N^+$ implant regions 6. In other embodiments described above the implant layer 7 may be formed from P-type material to thereby form a P-well device.

Figure 18:
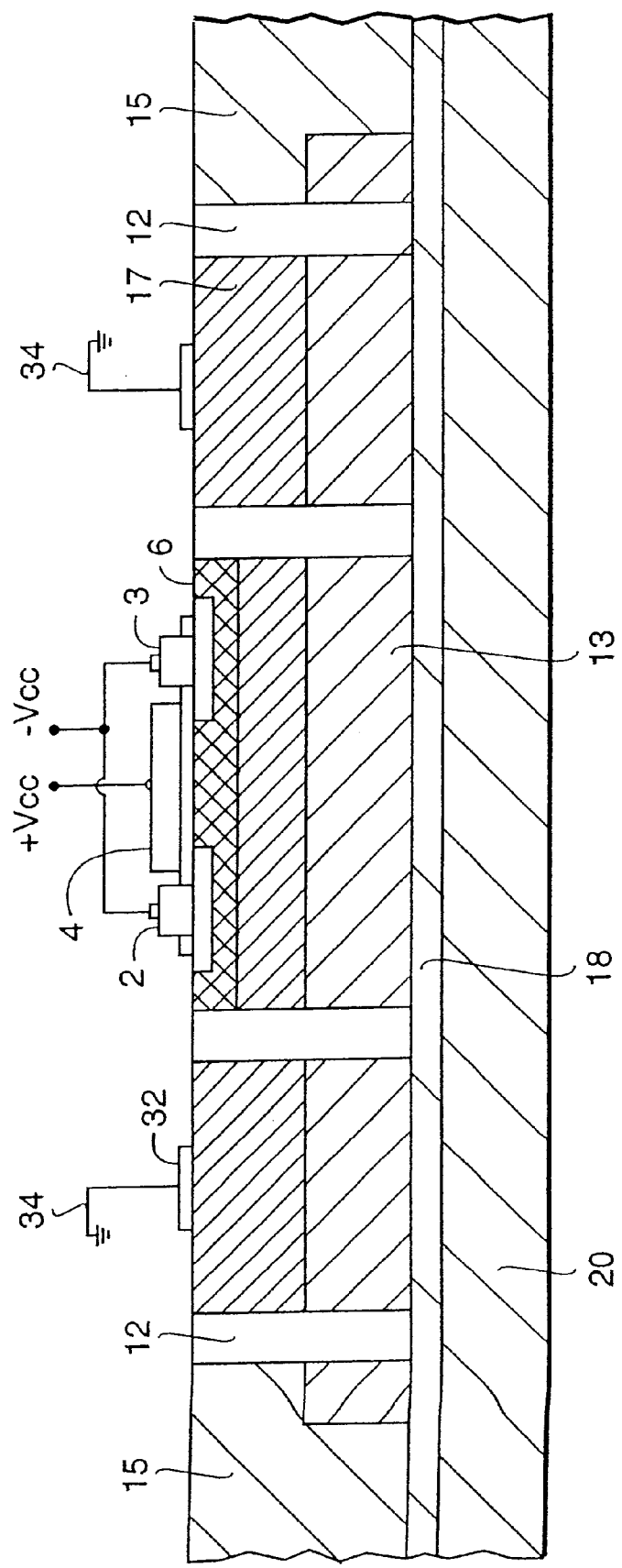

As shown in FIG. 18, the metal contacts 32 are preferably formed on the collector regions of the guard rings and the conductors 34 are preferably attached thereto. The source and drain metal patterns 2 and 3 are preferably formed over the two $N^+$ implant regions in the N-well implant layer 7. A thin LOCOS layer is grown over the N-well implant layer 7. After the formation of the LOCOS layer, a polysilicon layer is preferably grown over the LOCOS layer between the source 2 and drain 3. The polysilicon layer forms the P-gate 4 of the varactor 60. A metal contact may be placed on the polysilicon layer for connection via a conducting wire to +Vcc.

Several variations of the above techniques are possible. For example, as noted above, layers having different doping levels and concentrations may be used between the N-well and P-well implant layers of the varactors and the oxide layer 18. Thus, numerous modifications may be made to the IC varactor structures described above. Consequently, the invention is not limited by the specific illustrated embodiments, but only by the scope of the appended claims.

What is claimed is:

1. A semiconductor integrated circuit (IC) device comprising:

a) a substrate;

b) a first insulating layer formed on the substrate;

c) a first semiconductor layer formed on the insulating layer;

d) one of an N-well and P-well implant layer formed in the first semiconductor layer;

e) a first region of one of an $N^+$ and a $P^+$ implant formed in the one of an N-well and P-well implant layer;

f) a second region of one of an $N^+$ and a $P^+$ implant formed in the one of an N-well and P-well implant layer;

g) a second insulating layer formed over a selected portion of a surface of the one of an N-well and P-well implant layer;

h) a second semiconductor layer formed over a selected portion of a surface of the second insulating layer, and between the first region and the second region, wherein the second semiconductor layer forms one of a P-gate and an N-gate; and i) an isolation region extending from the first insulating layer to the second insulating layer and surrounding and electrically isolating the implant layer, the implant regions, and the second semiconductor layer.

2. The IC device according to claim 1, wherein the substrate is a high resistivity substrate.

3. The IC device according to claim 2, wherein the resistivity of the substrate is approximately 1 kohm-cm.

4. The IC device according to claim 3, wherein the first insulating layer comprises one of a silicon oxide and a ceramic insulating material.

5. The IC device according to claim 4, wherein the second insulating layer is formed from one of a local oxidation, a local nitridation, and a covalent bonding of silicon.

6. The IC device according to claim 4, wherein the first semiconductor layer further includes one of an N buried layer and a P buried layer formed adjacent to and above the first insulating layer.

7. The IC device according to claim 6, wherein the first semiconductor layer further includes one of an N collector layer and a P collector layer formed adjacent to and above the one of the N buried layer and the P buried layer.

8. The IC device according to claim 1, wherein the isolation region includes an isolation trench formed in the first semiconductor layer, wherein the trench extends from the first insulating layer to the second insulating layer and surrounds and electrically isolates the implant layer, the implant regions, and the second semiconductor layer.

9. The IC device according to claim 8, wherein the second semiconductor layer includes polysilicon.

10. A semiconductor integrated circuit (IC) device comprising:

a) a substrate;

b) a first insulating layer formed on the substrate;

c) a first semiconductor layer formed on the insulating layer;

d) an N-well implant layer formed in the first semiconductor layer;

e) a first region of an $N^+$ implant formed in the N-well implant layer;

f) a second region of an $N^+$ implant formed in the N-well implant layer;

g) a second insulating layer form over a selected portion of a surface of the N-well implant layer;

h) a second semiconductor layer formed over a selected portion of the surface of the second insulating layer, and between the first region and the second region, wherein the second semiconductor layer forms a P-gate; and i) an isolation region extending from the first insulating layer to the second insulating layer and surrounding and electrically isolating the implant layer, the implant regions, and the second semiconductor layer.

11. The IC device according to claim 10, wherein the substrate comprises high resistivity material.

12. The IC device according to claim 11, wherein the resistivity of the substrate comprises approximately 1 kohm-cm.

13. The IC device according to claim 12, wherein the first insulating layer comprises one of a silicon oxide and a ceramic insulating material.

14. The IC device according to claim 13, wherein the second insulating layer is formed from one of a local oxidation, a local nitridation, and a covalent bonding of silicon.

15. The IC device according to claim 13, wherein the first semiconductor layer further includes an N-buried layer formed adjacent to and above the first insulating layer.

16. The IC device according to claim 15, wherein the first semiconductor layer further includes an N collector layer formed adjacent to and above the N-buried layer.

17. The IC device according to claim 10, wherein the isolation region includes an isolation trench formed in the first semiconductor layer that extends from the first insulating layer to the second insulating layer, and wherein the isolation trench surrounds the implant layer, the implant regions, and the second semiconductor layer.

18. The IC device according to claim 17, wherein the second semiconductor layer includes polysilicon.

19. A semiconductor integrated circuit (IC) device comprising:

a) a substrate;

b) a first insulating layer formed on the substrate;

c) a first semiconductor layer formed on the insulating layer;

d) a P-well implant layer formed in the first semiconductor layer;

e) a first region of an $P^+$ implant formed in the P-well implant layer;

f) a second region of an $P^+$ implant formed in the P-well implant layer;

g) a second insulating layer formed over a selected portion of a surface of the P-well implant layer;

h) a second semiconductor layer formed over a selected portion of a surface of the second insulating layer and between the first region and the second region, wherein the second semiconductor layer forms an N-gate;

i) an isolation region extending from the first insulating layer to the second insulating layer and surrounding and electrically isolating the implant layer, the implant regions, and the second semiconductor layer.

20. The IC device according to claim 19, wherein the substrate comprises high resistivity material.

21. The IC device according to claim 20, wherein the resistivity of the substrate comprises approximately 1 kohm-cm.

22. The IC device according to claim 21, wherein the first insulating layer comprises one of a silicon oxide and a ceramic insulating material.

23. The IC device according to claim 22, wherein the second insulating layer is formed from one of a local oxidation, a local nitridation, and a covalent bonding of silicon.

24. The IC device according to claim 22, wherein the first semiconductor layer further includes a P-buried layer formed adjacent to and above the first insulating layer.

25. The IC device according to claim 24, wherein the first semiconductor layer further includes a P collector layer formed adjacent to and above the P-buried layer.

26. The IC device according to claim 19, wherein the isolation region includes an isolation trench formed in the first semiconductor layer that extends from the first insulating layer to the second insulating layer, and wherein the isolation trench surrounds the implant layer, the implant regions, and the second semiconductor layer.

27. The IC device according to claim 26, wherein the second semiconductor layer includes polysilicon.

* * * * *